(12) United States Patent
Noro et al.

(10) Patent No.: US 6,778,011 B2
(45) Date of Patent: Aug. 17, 2004

(54) PULSE-WIDTH MODULATION CIRCUIT AND POWER AMPLIFIER CIRCUIT

(75) Inventors: Masao Noro, Hamamatsu (JP); Nobuaki Tsuji, Hamamatsu (JP)

(73) Assignee: Yamaha Corporation, Hamamatsu (JP)

( * ) Notice: Subject to any disclaimer, the term of this patent is extended or adjusted under 35 U.S.C. 154(b) by 0 days.

(21) Appl. No.: 10/207,275

(22) Filed: Jul. 29, 2002

(65) Prior Publication Data

US 2003/0030486 A1 Feb. 13, 2003

(30) Foreign Application Priority Data

Jul. 31, 2001 (JP) ..................................... P2001-232428
Jun. 24, 2002 (JP) ..................................... P2002-182823

(51) Int. Cl.[7] ............................................... H03F 3/38
(52) U.S. Cl. ........................................ 330/10; 330/109
(58) Field of Search ....................... 330/10, 109, 207 A, 330/251, 124 R; 375/238

(56) References Cited

U.S. PATENT DOCUMENTS

| | | | |
|---|---|---|---|
| 5,767,740 A | 6/1998 | Fogg | ............................ 330/10 |
| 5,838,193 A | * 11/1998 | Myers et al. | .................. 330/10 |
| 6,188,187 B1 | * 2/2001 | Harlan | ......................... 318/254 |
| 6,420,930 B1 | * 7/2002 | Takagishi | .................... 330/251 |

FOREIGN PATENT DOCUMENTS

| | | |
|---|---|---|
| JP | 57-121308 | 7/1982 |
| JP | 61-21007 | 5/1986 |
| TW | 348341 | 12/1998 |

* cited by examiner

*Primary Examiner*—Linh M. Nguyen
(74) *Attorney, Agent, or Firm*—Pillsbury Winthrop LLP

(57) ABSTRACT

A pulse-width modulation circuit comprises a comparator having hysteresis characteristics of positive feedback, and an integrator, whose integrated output is compared with an input signal to produce a pulse-width modulation (PWM) signal having an advanced phase characteristic due to differentiation of the input signal. A switching circuit amplifies the pulse-width modulation signal based on the positive and negative source voltages ($V_{PX}$, $V_{MX}$). The amplified pulse-width modulation signal is supplied to a speaker via an LC filter, and it is also negatively fed back to the pulse-width modulation circuit. Since the pulse-width modulation signal whose phase is advanced is transmitted through the LC filter, it is possible to reduce phase revolution in the output of the power amplifier circuit. Thus, it is possible to effect negative feedback on the pulse-width modulation signal in a stable manner.

11 Claims, 10 Drawing Sheets

PULSE-WIDTH MODULATION CIRCUIT AND POWER AMPLIFIER CIRCUIT

BACKGROUND OF THE INVENTION

1. Field of the Invention

This invention relates to pulse-width modulation (PWM) circuits for use in power amplifier circuits such as self-excited class-D amplifiers. In addition, this invention also relates to power amplifier circuits using pulse-width modulation circuits.

2. Description of the Related Art

FIG. 10 shows an example of the configuration of a power amplifier circuit using a pulse-width modulation (PWM) circuit. Herein, an input signal such as an audio signal given from a signal source 31 is supplied to a pulse-width modulation circuit 33 in which it is subjected to pulse-width modulation. That is, the pulse-width modulation circuit 33 produces a PWM signal for driving a switching circuit 34. The switched output of the switching circuit 34 is supplied to a speaker 36 via an LC filter 35.

The pulse-width modulation circuit 33 contains an integrator 39 consisting of an operational amplifier 38 and a capacitor 38, and a comparator 43 consisting of an operation amplifier 40 and resistors 41 and 42. Herein, the integrator 39 and the comparator 43 having hysteresis characteristics are connected together in a cascade-connection manner, wherein the comparator 43 provides a PWM signal that is fed back to the integrator 39 via a resistor 44. The switching circuit 34 comprises an n-type field-effect transistor (FET) 45 and a p-type field-effect transistor (FET) 46. The LC filter 35 comprises an inductor (or inductance) 47 and a capacitor (or capacitance) 48.

The pulse-width modulation circuit 33 outputs a pulse signal having a duty ratio 50% unless no input signal is applied thereto. When the input signal is applied to the pulse-width modulation circuit 33, the integrator 39 provides the integrated output thereof that is shown in FIG. 11. The integrated output is supplied to the comparator 43 having hysteresis characteristics, which in turn produces a PWM signal resulting from the pulse-width modulation that is effected on the pulse signal in response to the input signal. In response to the PWM signal, the switching circuit 34 alternately switches on or off the FETs 45 and 46, so that the PWM signal is amplified and is then supplied to the speaker 36 via the LC filter 35. Thus, the speaker 36 is driven by the 'amplified' PWM signal.

If the speaker 36 is directly driven by the PWM signal, the carrier component of the PWM signal must be sent into the speaker 36 to deteriorate an efficiency in transducer, or it may destroy the speaker 36. For this reason, the LC filter 35 is interposed to eliminate the carrier component of the PWM signal.

The aforementioned power amplifier circuit using the pulse-width modulation circuit acts as a self-excited class-D amplifier, which may generally provide a 'flat' frequency characteristic shown in FIG. 12. Herein, the slope of the frequency characteristic curve may depend upon the characteristic and the order of the integrator. This circuit can effectively eliminate the carrier component of the PWM signal to provide a 'sharp' frequency characteristic close to that of the multi-order low-pass filter, for example.

Power amplifier circuits for use in audio devices are required to provide a low distortion ratio and low output impedance in order to eliminate unwanted influences to the sound quality. In the case of the power amplifier circuit using a linear amplifier, negative feedback is arranged with respect to the output side of the amplifier; therefore, it is possible to extremely reduce the distortion and output impedance in the output side of the amplifier. In the case of the power amplifier circuit using a pulse-width modulation circuit, it may be preferable to arrange negative feedback in the output side of the pulse-width modulation circuit. However, this power amplifier circuit operates based on the 'analog' input signal, while the PWM signal output from the pulse-width modulation circuit is a digital signal, which cannot be directly subjected to negative feedback. Therefore, this power amplifier circuit requires an LC filter as the low-pass filter for converting the PWM signal to the analog signal, wherein the output of the LC filter would be subjected to negative feedback. However, when the output of the LC filter is subjected to negative feedback, the LC filter may cause the distortion and the increase of the output impedance.

The LC filter is constituted in the second order comprising a single inductor and a single capacitor. Alternatively, it can be constituted in higher orders. The LC filter of the second order may produce phase revolution of 180° in the high frequencies range. In addition, the pulse-width modulation circuit inevitably provides the low-pass filter characteristic due to the integrator therein. Therefore, the signal transmitted through the LC filter provides phase revolution of 180° or more. Hence, there is a problem that the analog signal output from the LC filter cannot be subjected to negative feedback to the input signal.

In addition, the power amplifier circuit of FIG. 10 has the following problems:

That is, the gain G is produced between the input terminal P of the comparator 43 and the output terminal Q of the switching circuit 34, wherein the signal amplitude '$V_P$-$V_M$' (where '$V_P$' denotes the maximal value of the integrated output input to the input terminal P; and '$V_M$' denotes the minimal value) emerges at the input terminal P, while the signal amplitude '$V_{PX}$-$V_{MX}$' (where '$V_{PX}$' denotes the positive source voltage applied to the switching circuit 34; and '$V_{MX}$' denotes the negative source voltage) emerges at the output terminal Q. Herein, the gain G can be calculated in accordance with the following equation (1).

$$G = \frac{V_{PX} - V_{MX}}{V_P - V_M} \tag{1}$$

In the above equation (1), there is a possibility that each of the source voltages $V_{PX}$ and $V_{MX}$ may be varied. When each of them is varied, the gain G must be varied. As a result, the system stability of the power amplifier circuit should be altered. Thus, it must be required to further raise the system stability above the prescribed requirement.

SUMMARY OF THE INVENTION

It is an object of the invention to provide a power amplifier circuit using a pulse-width modulation circuit that can reduce phase revolution to secure negative feedback in a stable manner.

It is another object of the invention to provide a power amplifier circuit that guarantees the stable operation by suppressing variations of the gain thereof.

A pulse-width modulation circuit of this invention comprises a comparator whose noninverting input receives an input signal to output a pulse-width modulation (PWM)

signal, which is fed back to the noninverting input to provide hysteresis characteristics, and an integrator that integrates the pulse-width modulation signal and negatively feeds it back to the inverting input of the comparator.

A power amplifier circuit is constituted using the aforementioned pulse-width modulation circuit. In addition, a switching circuit is arranged to amplify the pulse-width modulation signal based on the positive source voltage ($V_{PX}$) and negative source voltage ($V_{MX}$). The amplified pulse-width modulation signal is supplied to a speaker via an LC filter, the output of which is negatively fed back to the pulse-width modulation circuit.

In the above, it is possible to supply the noninverting input of the comparator with either a fraction of the positive source voltage or a fraction of the negative source. Further, a triangular wave generation circuit is arranged inside of the pulse-width modulation circuit to provide a triangular waveform whose maximal and minimal values substantially match (specific fractions) of the positive and negative source voltages.

Since the pulse-width modulation signal whose phase is advanced is transmitted through the LC filter, it is possible to reduce phase revolution in the output of the power amplifier circuit. Thus, it is possible to effect negative feedback on the pulse-width modulation signal in a stable manner.

BRIEF DESCRIPTION OF THE DRAWINGS

These and other objects, aspects, and embodiments of the present invention will be described in more detail with reference to the following drawings, in which.

DESCRIPTION OF THE PREFERRED EMBODIMENTS

This invention will be described in further detail by way of examples with reference to the accompanying drawings.

Figure 1:
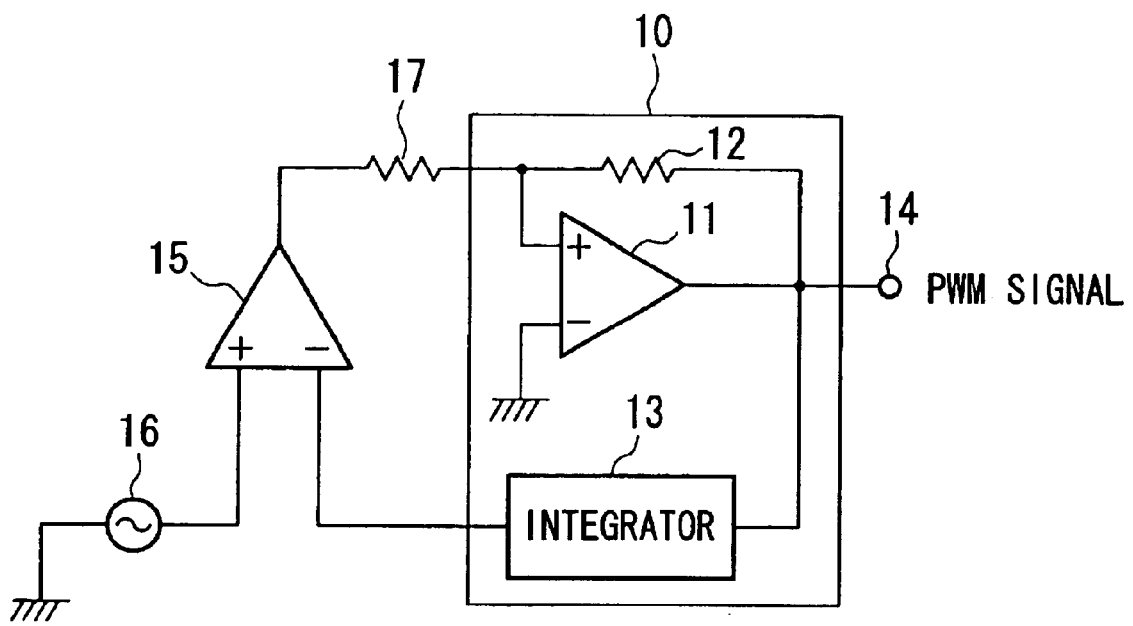
FIG. 1 is a circuit diagram showing the configuration of a pulse-width modulation circuit in accordance with a first embodiment of the invention.

FIG. 1 is a circuit diagram showing the configuration of a pulse-width modulation circuit in accordance with the first embodiment of the invention. That is, the pulse-width modulation circuit 10 comprises a comparator 11 having hysteresis characteristics, a resistor 12, and an integrator 13. The comparator 11 is constituted by an operational amplifier and produces a PWM signal, which is output via an output terminal 14 and is also subjected to positive feedback to a noninverting input (+) of the comparator 11 via the resistor 12. The integrator 13 provides the integrated output, which is supplied to an inverting input (−) of an amplifier 15. A noninverting input (+) of the amplifier 15 receives an input signal given from a signal source 16. The output of the amplifier 15 is supplied to the noninverting input of the comparator 11 via a resistor. An inverting input (−) of the comparator 11 is grounded. The amplifier 15 is constituted as a linear amplifier in order to obtain a loop gain.

Figure 2:
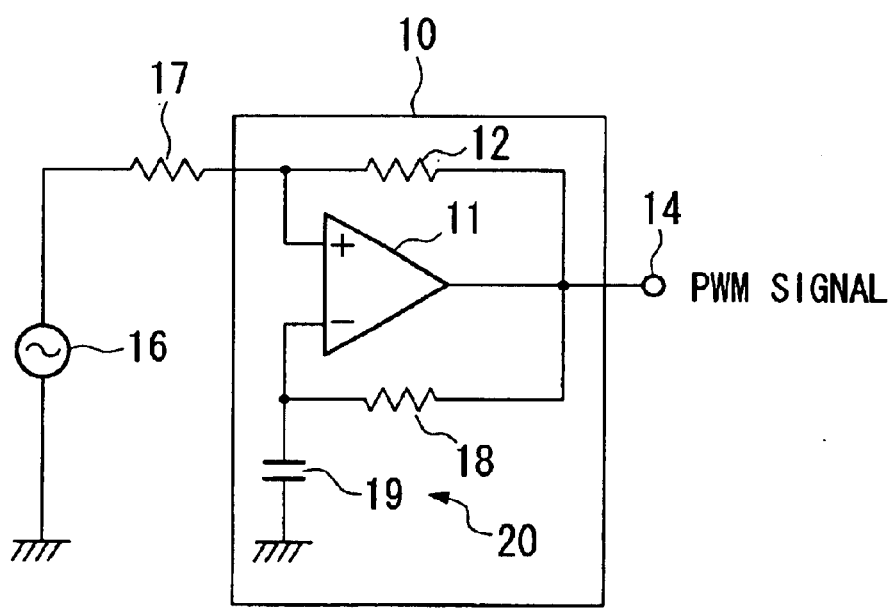
FIG. 2 is a circuit diagram showing the configuration of a pulse-width modulation circuit in accordance with a second embodiment of the invention.

FIG. 2 shows the configuration of a pulse-width modulation circuit in accordance with the second embodiment of the invention. That is, the pulse-width modulation circuit 10 comprises a comparator 11 having hysteresis characteristics, resistors 12 and 18, and a capacitor 19, wherein the comparator 11 is constituted by an operational amplifier. The resistor 18 and the capacitor 19 are combined together to form an integrator 20, the integrated output of which is supplied to an inverting input (−) of the comparator 11. An noninverting input (+) of the comparator 11 receives an input signal given from a signal source 16 via a resistor 17.

In each of the pulse-width modulation circuits 10 shown in FIGS. 1 and 2, the comparator 11 produces a PWM signal, based on which the integrator 13 or 20 provides the integrated output. The PWM signal and the integrated output are compared with each other by the comparator 11 having hysteresis characteristics, for which positive feedback using the resistor 12 is arranged. Therefore, the PWM signal output from the comparator 11 has the specific characteristic that may correspond to the differentiation result of the input signal. In other words, the pulse-width modulation circuit 10 has the differentiation characteristic in which the frequency response is increased by a slope of +6dB/oct, for example. Hence, the phase of the PWM signal progresses ahead of the input signal of the pulse-width modulation circuit 10 by 90°.

Figure 3:
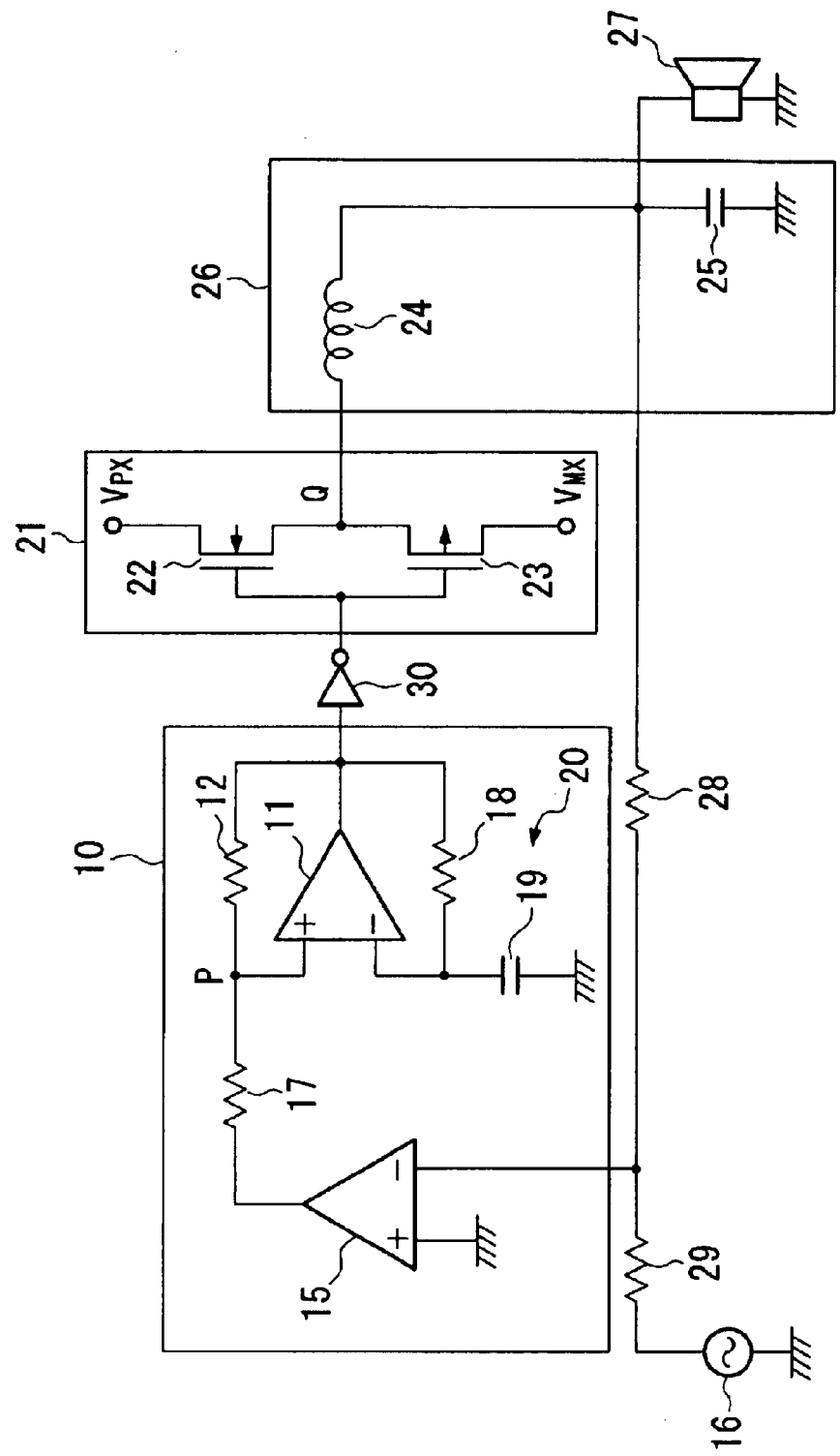
FIG. 3 is a circuit diagram showing the configuration of a power amplifier circuit using the pulse-width modulation circuit of FIG. 2 in accordance with a third embodiment of the invention.

FIG. 3 shows the configuration of a power amplifier circuit using the aforementioned pulse-width modulation circuit 10 in accordance with the third embodiment of the invention, wherein the power amplifier circuit is constituted as a self-excited class-D amplifier.

In FIG. 3, the pulse-width modulation circuit 10 produces a PWM signal, which is supplied to a switching circuit 21 consisting of transistors 22 and 23 via an inverter 30. The PWM signal alternately switches on or off the transistors 22 and 23. As a result, the PWM signal is amplified up to ±50V. The amplified PWM signal is supplied to a speaker 27 via an LC filter 26 consisting of an inductor (or inductance) 24 and a capacitor (or capacitance) 25. The output of the LC filter 26 is subjected to negative feedback to the inverting input (−) of the amplifier 15 (namely, inversion buffer) via a resistor 28. The inverting input of the amplifier 15 also receives an input signal given from the signal source 16 via a resistor 29. The amplified output of the amplifier 15 is supplied to the noninverting input (+) of the comparator 11 via a resistor 17.

Figure 4:
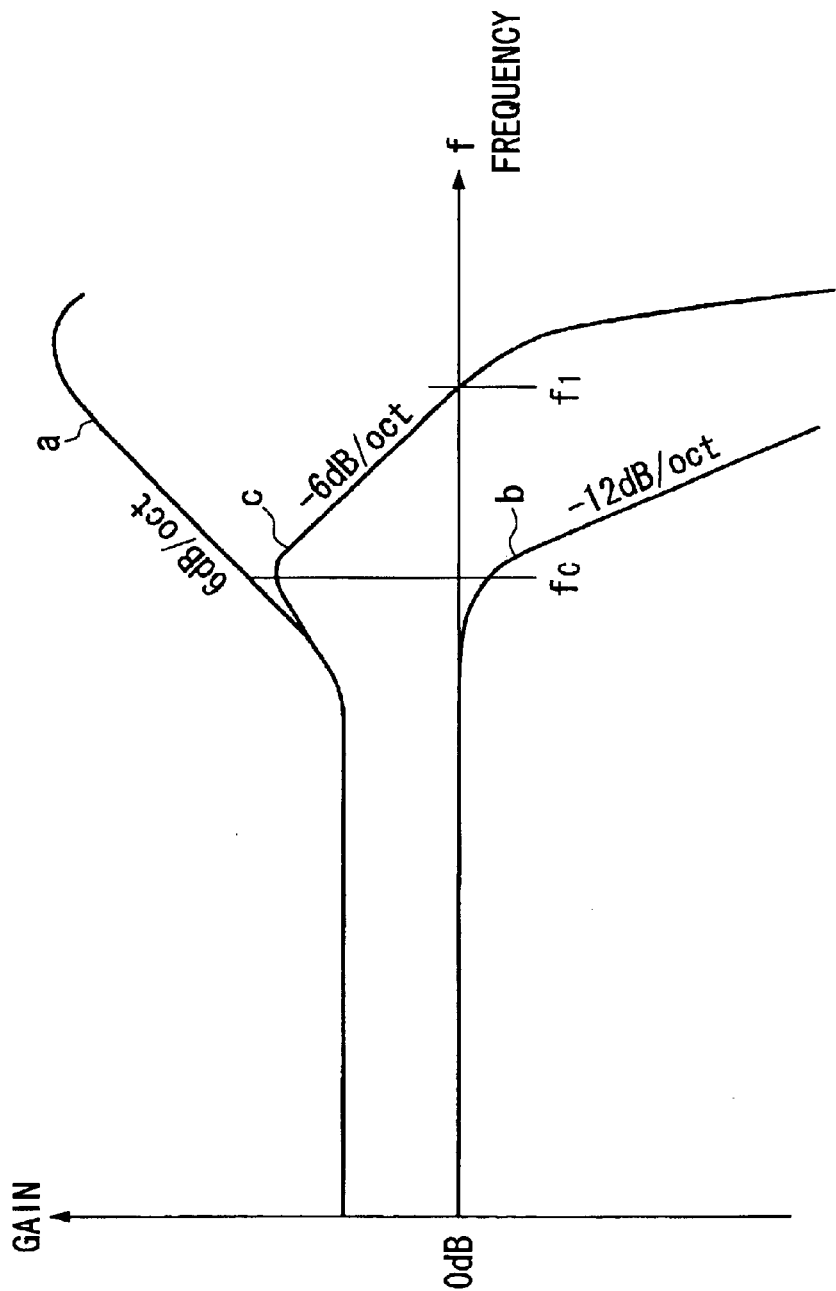
FIG. 4 is a graph showing frequency characteristics of the power amplifier circuit shown in FIG. 3.

FIG. 4 shows frequency characteristics of the power amplifier circuit shown in FIG. 3. Herein, reference symbol 'a' designates the frequency characteristic of the pulse-width modulation circuit 10, in which the gain increases in the high frequencies range by a slope of +6dB/oct. That is, the pulse-width modulation circuit 10 has the 'advanced' phase characteristic. Reference symbol 'b' designates the frequency characteristic of the LC filter 26, which has the 'delayed' phase characteristic in which the gain sharply decreases in proximity to a cutoff frequency fc (e.g., 50 kHz) by a slope of −12dB/oct. Reference symbol 'c' designates the combined frequency characteristic corresponding to a combination of the aforementioned frequency characteristics a and b. That is, the frequency characteristic c has a slope of −6dB/oct, by which the gain is decreased to 0 dB at a frequency f1 (e.g., 500 kHz).

FIG. 4 shows that in the power amplifier circuit, the pulse-width modulation circuit 10 can yield the prescribed differentiation characteristic of +6dB/oct at the prescribed frequency that is ten times (20dB) higher than the cutoff frequency fc of the LC filter. In other words, the pulse-width modulation circuit 10 acts as the first-order advanced system, while the LC filter 26 acts as the second-order delayed system. By combining them together, it is possible to reduce the phase revolution; therefore, it is possible to arranged negative feedback to operate in a stable manner.

The power amplifier circuit of FIG. 3 uses the aforementioned configuration of FIG. 2 for the pulse-width modulation circuit 10. Of course, it is possible to modify the power amplifier circuit in such a way that the pulse-width modulation circuit 10 employs the configuration of FIG. 1.

The power amplifier circuit of FIG. 3 may have a disadvantage in that due to variations of the source voltages $V_{PX}$ and $V_{MX}$ applied to the switching circuit 21, unwanted variations occur with respect to the gain effected between the input terminal P (corresponding to the noninverting input of the comparator 11) and the output terminal Q of the switching circuit 21. In order to suppress variations of the gain between the input terminal P and the output terminal Q, it may be necessary to use a highly stable power source for the switching circuit 21. However, this causes complexity of the circuit configuration and increases of the cost.

Next, a description will be given with respect to a fourth embodiment of the invention, which is designed to avoid occurrence of gain variations without using the highly stable power source.

Figure 5:
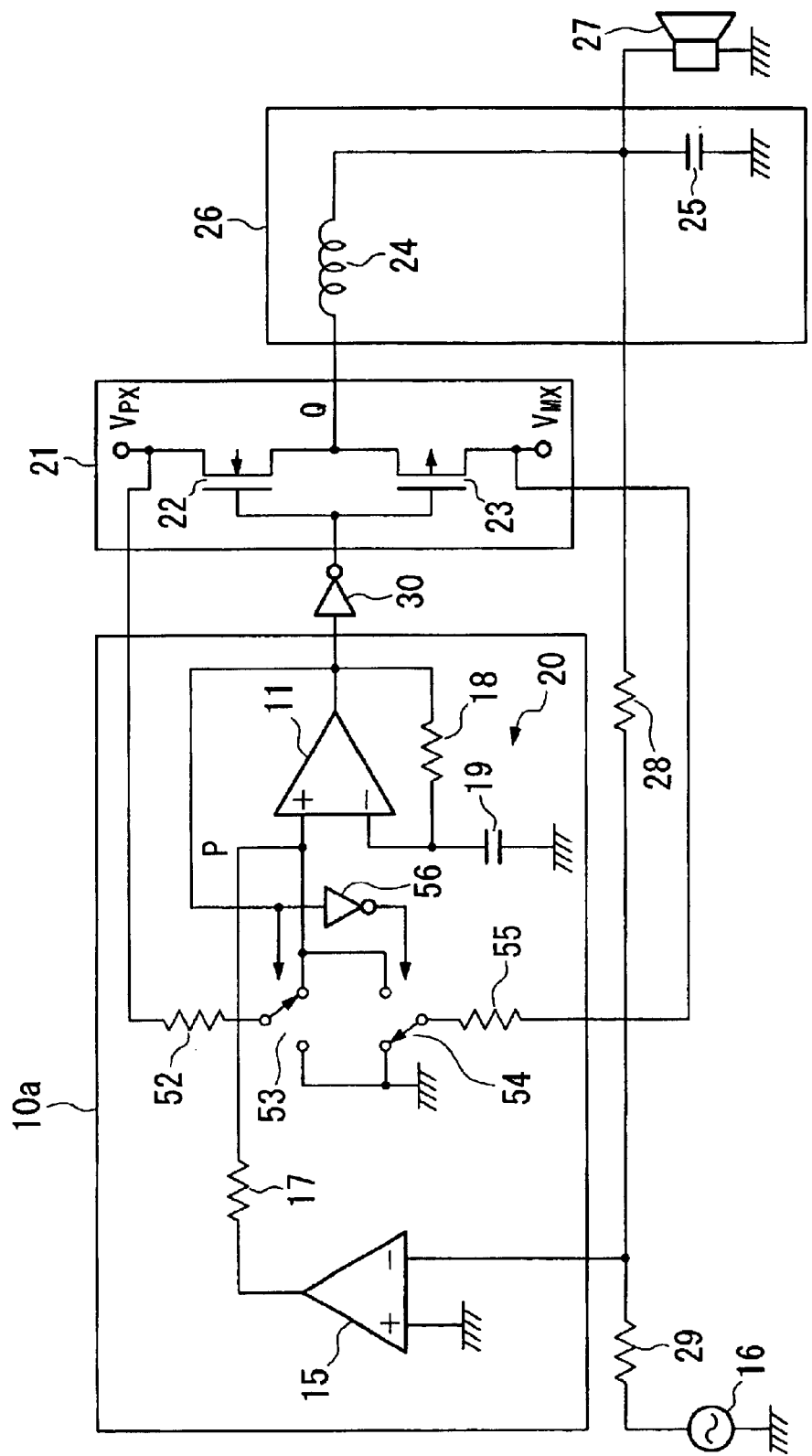
FIG. 5 is a circuit diagram showing the configuration of a power amplifier circuit in accordance with a fourth embodiment of the invention.

FIG. 5 shows the circuit configuration of a power amplifier circuit in accordance with the fourth embodiment of the invention. Unlike the aforementioned power amplifier circuit of FIG. 3, the power amplifier circuit of FIG. 5 arranges specific connections in a pulse-width modulation circuit 10a with respect to the source voltages $V_{PX}$ and $V_{MX}$ applied to the switching circuit 21. Compared with the pulse-width modulation circuit 10 shown in FIG. 3, the pulse-width modulation circuit 10a shown in FIG. 5 contains switches 53 and 54, resistors 52 and 55, and an inverter 56. That is, the positive source voltage $V_{PX}$ is connected to the common terminal of the switch 53 via the resistor 52, wherein the first contact (or right-side contact) of the switch 53 is connected to the noninverting input (+) of the comparator 11, and the second contact (or left-side contact) is grounded. In addition, the negative source voltage $V_{MX}$ is connected to the common terminal of the switch 54 via the resistor 55, wherein the first contact (or right-side contact) of the switch 54 is connected to the noninverting input of the comparator 11, and the second contact (or left-side contact) is grounded. The switch 53 is driven by the output of the comparator 11. That is, the switch 53 operates in such a way that the common terminal is connected with the first terminal when the output of the comparator 11 is high (H), while the common terminal is connected with the second contact when the output is low (L). In contrast, the switch 54 is driven by the output of the inverter 56, which inverts the output of the comparator 11. That is, the switch 54 operates in such a way that the common terminal is connected with the first contact when the output of the inverter 56 is high (H), while the common terminal is connected with the second contact when the output is low (L).

In the aforementioned circuit configuration shown in FIG. 5, the signal at the input terminal P (corresponding to the noninverting input of the comparator 11) varies between the maximal value $V_P$ and the minimal value $V_M$, which are respectively defined in proportion to the source voltages $V_{PX}$ and $V_{MX}$ applied to the switching circuit 21. As a result, the gain between the input terminal P and the output terminal Q takes a constant (see equation (1)) that is completely irrelevant to the source voltages $V_{PX}$ and $V_{MX}$. Thus, it is possible to reliably avoid occurrence of gain variations due to the source voltages $V_{PX}$ and $V_{MX}$.

Figure 6:
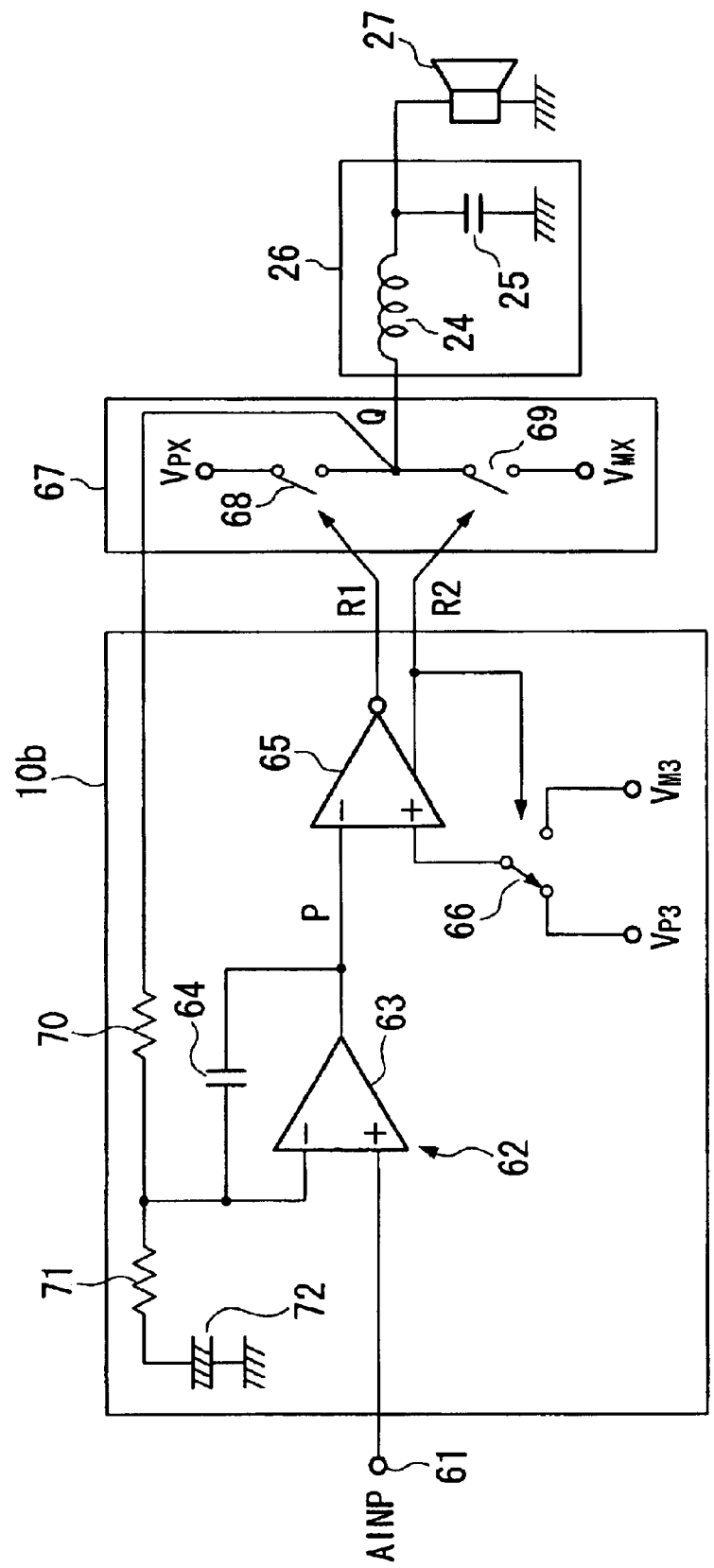
FIG. 6 is a circuit diagram showing the configuration of a power amplifier circuit in accordance with a fifth embodiment of the invention.

FIG. 6 shows the configuration of a power amplifier circuit in accordance with the fifth embodiment of the invention. The power amplifier circuit of FIG. 6 comprises a pulse-width modulation circuit 10b and a switching circuit 67 in addition to the LC filter 26 and the speaker 27. Reference numeral 61 designates an input terminal for inputting an analog input signal from the external device or system. The pulse-width modulation circuit 10b comprises an integrator 62 consisting of an operational amplifier 63 and a capacitor 64, a comparator 65, a switch 66, resistors 70 and 71, and a capacitor 72. The input terminal 61 is connected with the noninverting input (+) of the operational amplifier 63, the output of which is fed back to the inverting input (−). The output of the operational amplifier 63 is also supplied to the inverting input (−) of the comparator 65, which in turn provides an inverting output signal R1. The common terminal of the switch 66 is connected with the noninverting input (+) of the comparator 65, which in turn provides a noninverting output signal R2. The switch 66 is driven by the noninverting output signal R2 of the comparator 65. Specifically, the common terminal of the switch 66 is connected with the first contact (or right-side contact) when the noninverting output signal R2 is high (H), while the common terminal is connected with the second contact (or left-side contact) when the noninverting output signal R2 is low (L). The first contact of the switch 66 is supplied with a voltage $V_{M3}$, while the second contact is supplied with a voltage $V_{P3}$. These voltages are defined as follows:

$$V_{M3} = \frac{V_{MX}}{a} \quad (2)$$

$$V_{P3} = \frac{V_{PX}}{a} \quad (3)$$

where 'a' denotes a positive constant arbitrarily selected.

The switching circuit 67 comprises switches 68 and 69 that are connected in series. Herein, the switch 68 is controlled to be turned on or off in response to the inverting output signal R1 of the comparator 65, while the switch 69 is controlled to be turned on or off in response to the noninverting output signal R2 of the comparator 65. One end of the switch 68 is supplied with positive source voltage $V_{PX}$, while one end of the switch 69 is supplied with negative source voltage $V_{MX}$. These switched are connected together at the output terminal Q. Therefore, the switching circuit 67 provides the output signal at the output terminal Q and supplies it to the speaker 27 via the LC filter consisting of the inductor 24 and the capacitor 25. In addition, the output signal of the switching circuit 67 is fed back to the integrator 62 via the resistor 70 in the pulse-width modulation circuit 10b. Herein, the feedback value depends upon the resistors 70 and 71. The resistor 71 is grounded via the capacitor 72, which is used to shut off dc components flowing therethrough.

Figure 7:
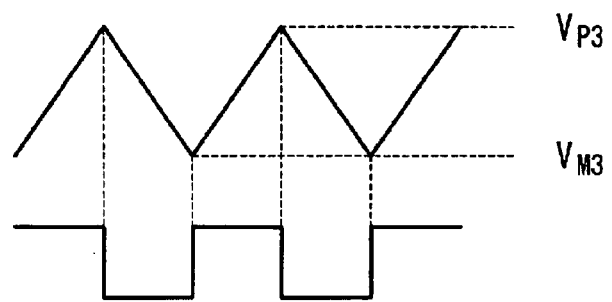
FIG. 7A shows variations of the signal at the input terminal P of a comparator included in a pulse-width modulation circuit shown in FIG. 6.
FIG. 7B shows a pulse signal R1 output from the inverting output terminal of the comparator shown in FIG. 6.
FIG. 7C shows a pulse signal R2 output from the noninverting output terminal of the comparator shown in FIG. 6.

Every time the output signals R1 and R2 of the comparator 65 are inverted in levels, the switches 68 and 69 of the switching circuit 67 are selectively turned on and off. In response to on/off states of the switches 68 and 69 alternately switched over, the capacitor 64 contained in the integrator 62 is being repeatedly charged or discharged. FIGS. 7A, 7B, and 7C show relationships between the signal at the input terminal P of the comparator 65 (corresponding to the output terminal of the integrator 62), and the output signals R1 and R2 of the comparator 65 under the condition where the input signal is zero. Herein, the signal P has a sawtooth waveform, the level of which is repeatedly increased and decreased between the voltages $V_{P3}$ and $V_{M3}$ applied to the opposite contacts of the switch 66. The output signals R1 and R2 have pulse waveforms that are inverse to each other. When the input signal is applied to the input terminal 61, the charging/discharging duration of the capacitor 64 varied in response to the input signal. As a result, the pulse widths of the output signals R1 and R2 correspondingly vary in response to the input signal.

The gain 'G1' in the view from the output terminal Q of the switching circuit 67 to the input terminal P of the comparator 65 can be calculated in accordance with the following equation (4).

$$G1 = \frac{\frac{1}{2}\pi f \cdot Cf}{Rf} \quad (4)$$

where Cf denotes the capacitance of the capacitor 64, and Rf denotes the resistance of the resistor 70.

The gain 'G' in the view from the input terminal P of the comparator 65 to the output terminal Q of the switching circuit 67 can be calculated with reference to the foregoing equations (1), (2), and (3), as follows:

$$G = \frac{V_{PX} - V_{MX}}{V_{P3} - V_{M3}} = \frac{V_{PX} - V_{MX}}{V_{PX}/a - V_{MX}/a} = a \quad (5)$$

That is, the gain G is not affected by the source voltages $V_{PX}$ and $V_{MX}$ of the switching circuit 67.

Figure 8:
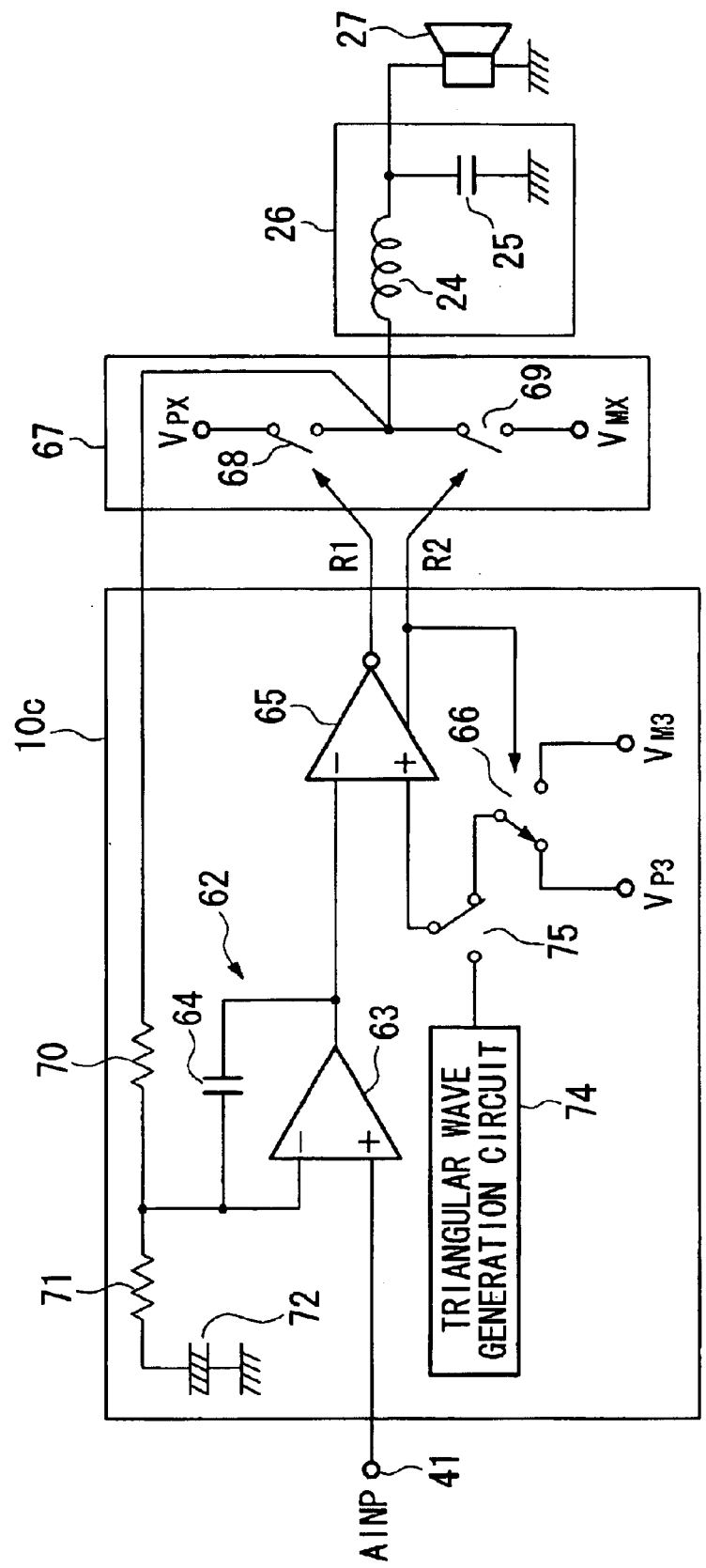
FIG. 8 is a circuit diagram showing the configuration of a power amplifier circuit in accordance with a sixth embodiment of the invention.

FIG. 8 shows the configuration of a power amplifier circuit in accordance with the sixth embodiment of the invention, wherein parts identical to those shown in FIG. 6 are designated by the same reference numerals. The power amplifier circuit of FIG. 8 comprises a pulse-width modulation circuit 10c in addition to the switching circuit 67, LC filter 26, and speaker 27. The pulse-width modulation circuit 10c comprises a triangular wave generation circuit 74 and a manual switch 75 in addition to the aforementioned circuit components included in the pulse-width modulation circuit 10b shown in FIG. 6. That is, the noninverting input (+) of the comparator 65 is connected with the common terminal of the manual switch 75. The first contact (or right-side contact) of the manual switch 75 is connected with the common terminal of the switch 66, and the second contact (or left-side contact) is connected with the output terminal of the triangular wave generation circuit 74.

In the aforementioned configuration, when the manual switch 75 is operated to establish a connection with the first contact, the pulse-width modulation circuit 10c operates in conformity with the aforementioned pulse-width modulation circuit 10b. Therefore, the pulse-width modulation circuit 10c acts as the self-excited pulse-width modulation circuit. When the manual switch 75 is operated to establish a connection with the second contact, the output of the triangular wave generation circuit 74 is supplied to the noninverting input of the comparator 65 via the switch 75, wherein the switch 66 is neglected. Therefore, the pulse-width modulation circuit 10c acts as the externally-excited pulse-width modulation circuit. In this case, it may be necessary to control the triangular wave generation circuit 74 in such a way that the maximal value and minimal value of the triangular wave depend upon the source voltages $V_{PX}$ and $V_{MX}$ of the switching circuit 67. Thus, it is possible to arrange the power amplifier circuit of FIG. 8 not to be affected by the source voltages $V_{PX}$ and $V_{MX}$ of the switching circuit 67 as similarly to the power amplifier circuit of FIG. 6.

Figure 9:
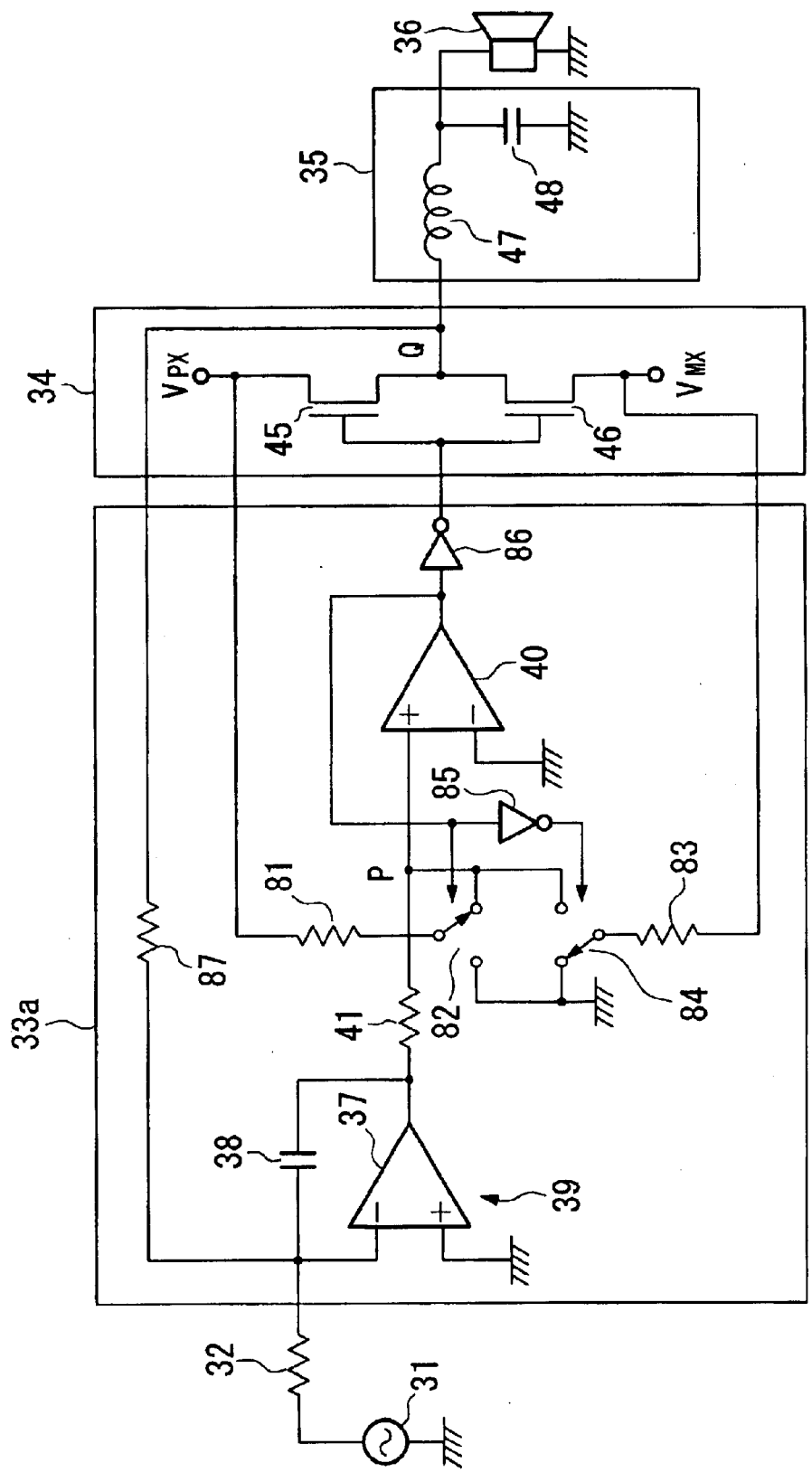
FIG. 9 is a circuit diagram showing the configuration of a power amplifier circuit in accordance with a seventh embodiment of the invention.
Figure 10:
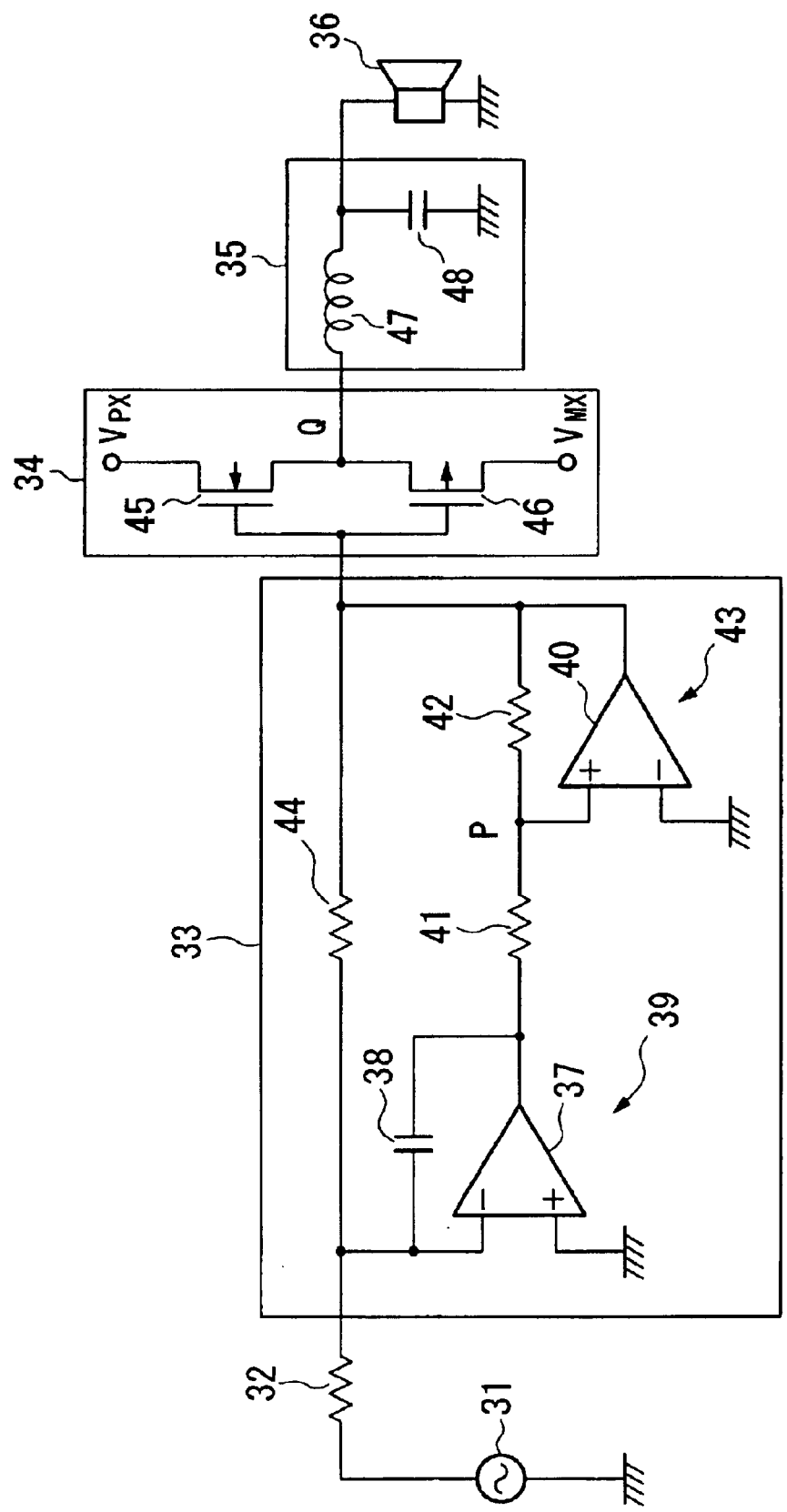
FIG. 10 is a circuit diagram showing a typical example of the configuration of a power amplifier circuit using a pulse-width modulation circuit.
Figure 11:
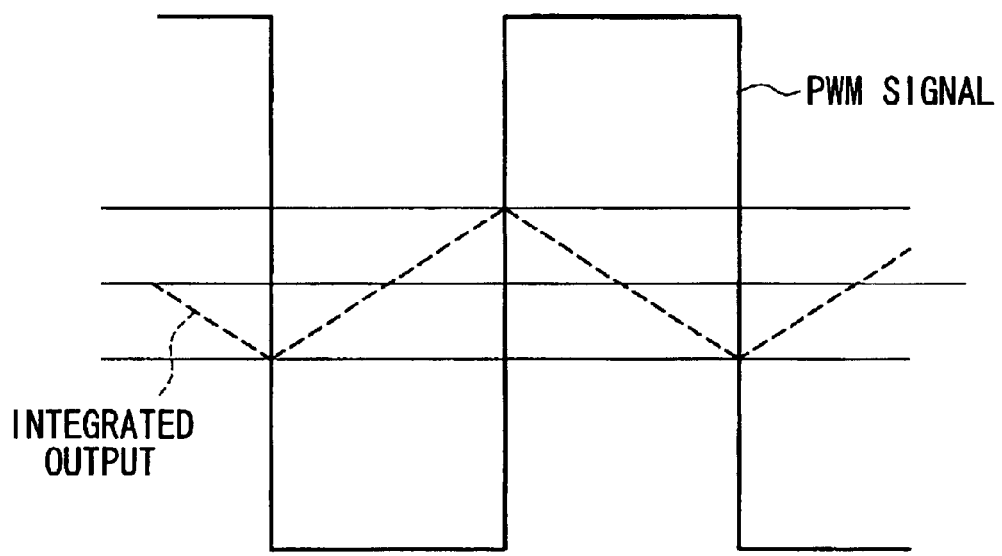
FIG. 11 shows waveforms of a PWM signal and integrated output produced in a pulse-width modulation circuit shown in FIG. 10.
Figure 12:
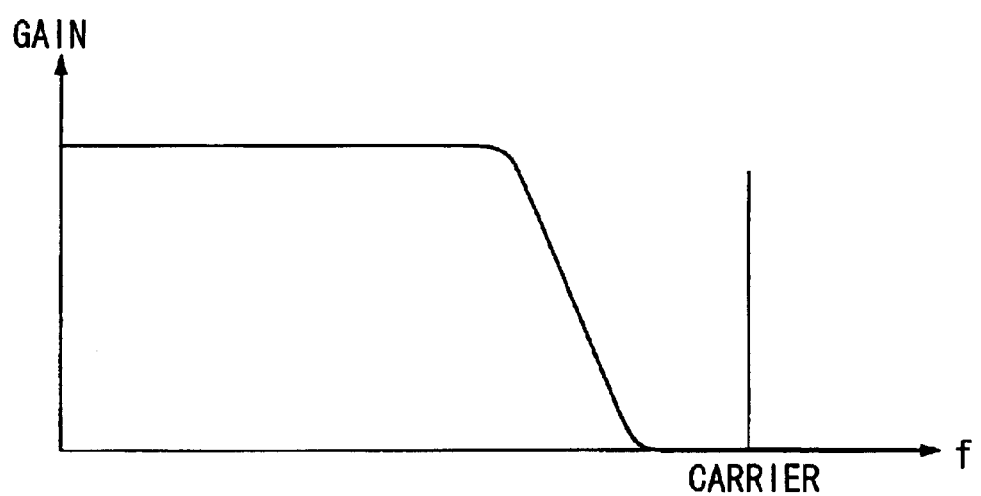
FIG. 12 is a graph showing a frequency characteristic of the power amplifier circuit shown in FIG. 10.

FIG. 9 shows the configuration of a power amplifier circuit in accordance with the seventh embodiment of the invention, which is designed to improve the aforementioned power amplifier circuit of FIG. 10. Compared with the power amplifier circuit of FIG. 10, the power amplifier circuit of FIG. 9 comprises a pulse-width modulation circuit 33a in addition to the aforementioned switching circuit 34, LC filter 35, and speaker 36. The pulse-width modulation circuit 33a comprises resistors 81, 83, and 87, switches 82 and 84, and inverters 85 and 86 in addition to the aforementioned circuit components included in the pulse-width modulation circuit 33 shown in FIG. 10. That is, the positive source voltage $V_{PX}$ of the switching circuit 34 is connected to the common terminal of the switch 82 via the resistor 81. The first contact (or right-side contact) of the switch 82 is connected with the noninverting input (+) of the comparator 40, and the second contact (or left-side contact) is grounded. In addition, the negative source voltage $V_{MX}$ of the switching circuit 34 is connected to the common terminal of the switch 84 via the resistor 83. The first contact (or right-side contact) of the switch 84 is connected with the noninverting input of the comparator 40, and the second contact (or left-side contact) is grounded. The switch 82 is driven by the output of the comparator 40. That is, the common terminal of the switch 82 is connected with the first contact when the output of the comparator 40 is high (H), while the common terminal is connected with the second contact when the output of the comparator 40 is low (L). The switch 84 is driven by the output of the inverter 85, which inverts the output of the comparator 40. That is, the common terminal of the switch 84 is connected with the first contact when the output of the inverter 85 is high (H), while the common terminal is connected with the second contact when the output of the inverter 85 is low (L).

The output of the comparator 40 is inverted by the inverter 86 and is then supplied to both the gates of the transistors 45 and 46. The signal at the output terminal Q of the switching circuit 34 is fed back to the integrator 39 via the resistor 87.

The power amplifier circuit of FIG. 9 operates basically similar to the aforementioned power amplifier circuit of FIG. 5. That is, the integrator 39 provides the input terminal P of the comparator 40 with the integrated output having a triangular waveform whose maximal value ($V_P$) and minimal value ($V_M$) may be proportional to the source voltages $V_{PX}$ and $V_{MX}$ of the switching circuit 34 respectively. As a result, the gain in view from the input terminal P of the comparator 40 to the output terminal Q of the switching circuit 34 can be defined as the constant that is irrelevant to the source voltages $V_{PX}$ and $V_{MX}$ (see equation (1)). Thus, it is possible to reliably avoid occurrence of gain variations due to the source voltages $V_{PX}$ and $V_{MX}$.

As described heretofore, this invention has a variety of technical features and effects, which will be described below.

(1) The power amplifier circuit uses a pulse-width modulation circuit in which a comparator compares the integrated output of the PWM signal with the input signal, so that the PWM signal is subjected to positive feedback to provide hysteresis characteristics. Herein, the pulse-width modulation circuit acts as the advanced phase circuit, which is followed by the low-pass filter such as the LC filter. Therefore, it is possible to reduce phase revolution. As a result, it is possible to effect negative feedback on the output of the low-pass filter in a stable manner. In addition, it is possible to reduce the distortion and the output impedance in the output side of the power amplifier circuit.

(2) The power amplifier circuit contains a switching circuit, to which positive and negative source voltages are applied, and one of which is selectively supplied to the input of the comparator. Therefore, it is possible to reliably suppress gain variations due to variations of source voltages of the switching circuit. This guarantees the stable operation for the power amplifier circuit.

(3) Alternatively, the power amplifier circuit contains a switching circuit, which selectively provides the input of the comparator with either a fraction of the positive source voltage or a fraction of the negative source voltage, which is divided by a certain division ratio. Therefore, it is possible to reliably suppress gain variations due to variations of source voltages. This guarantees the stable operation for the power amplifier circuit.

(4) The power amplifier circuit can contain a triangular wave generation circuit for outputting a triangular waveform, the maximal and minimal values of which respectively match a fraction of the positive source voltage and a fraction of the negative source voltage, which are divided by a certain division ratio in the switching circuit. In addition, a switching means is arranged in the pulse-width modulation circuit to selectively supply the input of the comparator with either the output of the triangular wave generation circuit or the output of the switching circuit. Thus, it is possible to operate the power amplifier circuit as of the self-excited type or the externally-excited type.

As this invention may be embodied in several forms without departing from the spirit or essential characteristics thereof, the present embodiments are therefore illustrative and not restrictive, since the scope of the invention is defined by the appended claims rather than by the description preceding them, and all changes that fall within metes and bounds of the claims, or equivalents of such metes and bounds are therefore intended to be embraced by the claims.

What is claimed is:

1. A power amplifier circuit comprising: a pulse-width modulation circuit that contains an integrator for providing an integrated output thereof as a first output signal and a comparator for comparing the first output signal with an input signal to produce a pulse-width modulation signal, which is subjected to positive feedback to the comparator, thus providing hysteresis characteristics;

a low-pass filter for performing low-pass filleting on the pulse-width modulation signal to output, second output signal; and a negative feedback circuit for negatively feeding beck the second output signal to the comparator, wherein an output terminal of the comparator is connected to an input terminal of the comparator via a resistor by which the pulse-width modulation signal cutout from the comparator is positively fed back to the comparator and wherein the resistor is directly connected to the output of the comparator.

2. A power amplifier circuit according to claim 1, wherein the low-pass filter is constituted as an LC filter whose output is supplied to a prescribed load.

3. A power amplifier circuit comprising:

a pulse-width modulation circuit that contains an integrator for providing an integrated output thereof as a first output signal, and a comparator for comparing the first output signal with an input signal to produce a pulse-width modulation signal, which is output as a second output signal and is positively fed back to the comparator, thus providing hysteresis characteristics, a switching circuit, driven by the second output signal, for amplifying the second output signal and for outputting it as a third output signal;

a low-pass filter for inputting the third output signal and for outputting it as a fourth output signal; and a negative feedback circuit for negatively feeding back the fourth output signal to the comparator;

wherein the switching circuit is supplied with a positive source voltage and a negative source voltage, one of which is selectively supplied to an input of the comparator in response to the second cutout signal of the comparator.

4. A power amplifier circuit according to claim 3, wherein the low-pass filter is constituted as era IC filter whose output is supplied toe prescribed load.

5. A power amplifier circuit according to claim 3, further including a first series circuit consisting of a resistor and a switch that are interposed between the input of the comparator and the switching circuit with respect to the positive source voltage, and a second series circuit consisting of a resister and a switch that are interposed between the input of the comparator and the switching circuit with respect to the negative source voltage, wherein the positive source voltage is applied to a common terminal of the switch in the first series circuit and the negative source voltage is applied to a common terminal of the switch in the second series circuit.

6. A cower amplifier circuit comprising:

a pulse-width modulation circuit that contains an integrator for providing an integrated output thereof as a first output signal, and a comparator for comparing the first output signal with an input signal to produce a pulse, width modulation signal, which is output as a second output signal and is positively fed back to the comparator, thus providing hysteresis characteristics;

a switching circuit, driven by the second output signal br amplifying the second output signal and for outputting it as a third cutout signal;

a low-pass filter for inputting the third output signal and for outputting it as a fourth output signal;

a negative feedback circuit for negatively feeding back the fourth output signal to the comparator; and a first series circuit consisting of a resistor and a switch that are interposed between the input of the comparator and the switching circuit with respect to a positive source voltage, and a second series circuit consisting of a resistor and a switch that are interposed between the input of the comparator and the switching circuit with respect to a the negative source voltage, wherein the switching circuit is supplied with the positive source voltage and the negative source voltage, one of which is selectively to an input of the comparator in response to the second cutout signal of the comparator.

7. A power amplifier circuit comprising:

an integrator that contains an amplifier means whose first input corresponds to an input signal and whose second input receives a pulse-width modulation signal being fed back thereto, and a capacitor interposed between an output and the second input of the amplifier means;

a comparator for comparing an output of the integrator with a voltage that is supplied thereto from a switch, thus producing a pulse-width modulation signal;

a switching circuit, driven by an output of the comparator based on a positive source voltage and a negative source voltage, for amplifying the pulse-width modulation signal; and a low-pass filler for inputting the amplified pulse-width modulation signal outputted from the switching circuit, wherein the switch operates in response to the output of the comparator to selectively supply the input of the comparator with either a fraction of the positive source voltage or a fraction of the negative source voltage, which is divided by a specific division ratio.

8. A power amplifier circuit according to claim 7 further comprising a triangular wave generation circuit for producing a triangular waveform whose maximal and minimal values substantially match the fraction of the positive source voltage and the fraction of the negative source voltage, and a switchover means for selectively supplying the input of the comparator with either an output of the triangular wave generation circuit or an output of the switch.

9. A power amplifier circuit, comprising:

a pulse-width modulation circuit including an integrator for integrating an input signal to produce a first output signal, and a comparator for comparing the first output signal supplied to a first input terminal thereof with a ground potential applied to a second input terminal thereof, thus producing a pulse-width modulation signal;

a switching circuit that is driven by the pulse-width modulation signal so as to amplify the pulse-width modulation signal, thus producing a second output signal;

a low-pass filter for performing filtering on the second output signal output from the switching circuit;

a negative feedback circuit for negatively feeding back the second output signal; and a voltage supply circuit for, in response to the pulse-width modulation signal output from the comparator, switching over a positive supply voltage and a negative supply voltage, both of which are applied to the switching circuit and one of which is selectively applied to the first input terminal of the comparator.

10. A power amplifier circuit according to claim 9, wherein the power supply circuit comprises a first series circuit, including a first resistor and a first switch, which is arranged between a first terminal of the switching circuit receiving the positive supply voltage and the first input terminal of the comparator, and a second series circuit, including a second resistor and a second switch, which is arranged between a second terminal of the switching circuit receiving the negative supply voltage and the first input signal of the comparator.

11. A power amplifier circuit according to claim 10, wherein each of the first switch and the second switch is controlled in switching in response to the pulse-width modulation signal output from the comparator.

* * * * *